US 7,841,788 B2

(12) United States Patent
Higuchi et al.

(10) Patent No.: US 7,841,788 B2
(45) Date of Patent: Nov. 30, 2010

(54) SUBSTRATE PROCESSING APPARATUS AND SUBSTRATE PROCESSING METHOD

(75) Inventors: Ayumi Higuchi, Kyoto (JP); Kenichiro Arai, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 827 days.

(21) Appl. No.: 11/689,077

(22) Filed: Mar. 21, 2007

(65) Prior Publication Data
US 2007/0223916 A1    Sep. 27, 2007

(30) Foreign Application Priority Data
Mar. 22, 2006  (JP)  .............................. 2006-078529
Jan. 12, 2007   (JP)  .............................. 2007-004276

(51) Int. Cl.
G03D 5/00    (2006.01)
(52) U.S. Cl. .................. 396/611; 396/617; 396/626
(58) Field of Classification Search ................. 396/611, 396/617, 572, 641, 626
See application file for complete search history.

(56) References Cited
U.S. PATENT DOCUMENTS

| 6,022,153 | A  | * | 2/2000  | Mogi ........................... 396/626 |
| 7,285,492 | B2 | * | 10/2007 | Wang et al. .................. 438/674 |
| 7,392,814 | B2 | * | 7/2008  | Hasegawa et al. ......... 134/102.1 |
| 2005/0224132 | A1 | * | 10/2005 | Jang ............................... 141/1 |
| 2006/0151001 | A1 | * | 7/2006  | Satoyoshi et al. .............. 134/1 |
| 2006/0201363 | A1 |   | 9/2006  | Nakatsukasa et al. |
| 2008/0197516 | A1 | * | 8/2008  | Abe et al. ..................... 261/75 |

FOREIGN PATENT DOCUMENTS

| CN | 1095187      | 11/1994 |
| CN | 1115588 A    | 1/1996  |
| JP | 7-326570     | 12/1995 |
| KR | 10-2001-36625 | 6/2001 |
| WO | WO 2005/015625 | 2/2005 |

OTHER PUBLICATIONS

Chinese Official Action dated Jul. 4, 2008 and English translation thereof.

* cited by examiner

Primary Examiner—Melissa J Koval
Assistant Examiner—Linda B Smith
(74) Attorney, Agent, or Firm—Ostrolenk Faber LLP

(57) ABSTRACT

In a substrate processing apparatus of the present invention, a buffer bath is provided at any point in a supplying passage of a processing solution supplying part, and a micro bubble generator is provided in the buffer bath. When a substrate is processed, large quantities of micro bubbles can be generated and stored in the buffer bath, and the micro bubbles can be supplied from the buffer bath to a processing bath. This enables the large quantities of micro bubbles to be supplied to the surrounding of the substrate, while the use of the small micro bubble generator avoids an increase in the size of the substrate processing apparatus.

18 Claims, 8 Drawing Sheets

F I G . 2
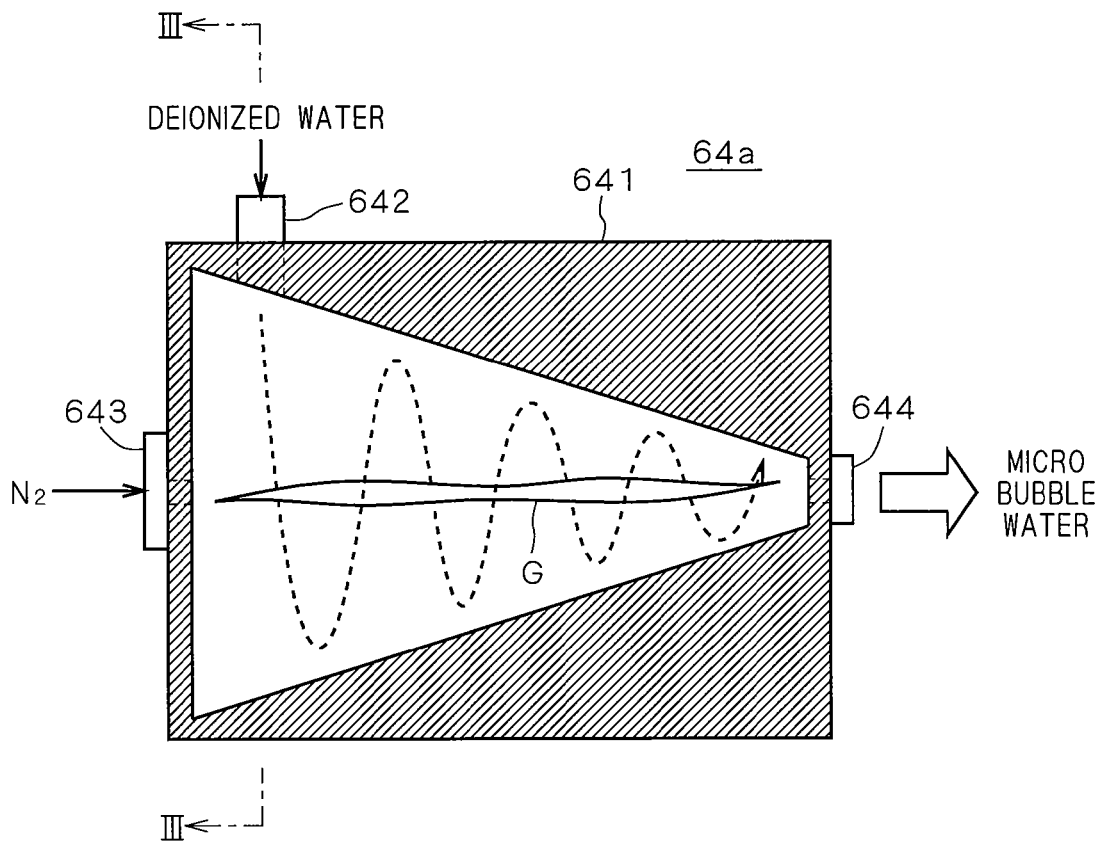
F I G . 3
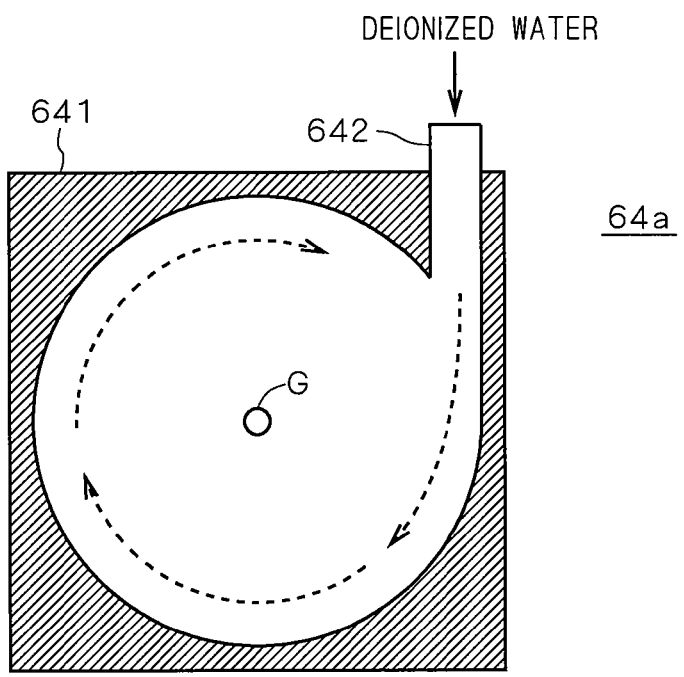

SUBSTRATE PROCESSING APPARATUS AND SUBSTRATE PROCESSING METHOD

BACKGROUND OF THE INVENTION

1. Field of the Invention

The present invention relates to a substrate processing apparatus that performs a predetermined process of substrates, such as semiconductor wafers, glass substrates for liquid crystal display devices, and glass substrates for PDPs, by using a processing solution.

2. Description of the Background Art

Conventionally, substrate processing apparatuses have been known which perform a predetermined process of cleaning, etching, or the like by supplying a processing solution, such as deionized water, a chemical solution, or the like, to substrates in substrate manufacturing processes. This type of substrate processing apparatuses are generally classified as substrate processing apparatuses of batch processing which perform a predetermined process by immersing a plurality of substrates at a time in a processing solution stored in a processing bath, and substrate processing apparatuses of single wafer processing which perform a predetermined process by discharging a processing solution to the surfaces of substrates that are held one by one by a holding part.

In these substrate processing apparatuses, the process of removing particles adhered on the substrates is carried out at the proper time. Usually, a fluid stream of the processing solution is caused along the surfaces of the substrates, and the action of the fluid stream is used to convey and remove the particles from the surfaces of the substrates. In an alternative, ultrasonic vibration is supplied into the processing solution in order to urge the separation and removal of the particles from the substrates by the shock of the ultrasonic vibration.

In particular, the following technique has been proposed recently. That is, micro bubbles are generated in a processing solution, and high particle adsorbability of the micro bubbles is used to remove particles from the inside of a processing bath. When using micro bubbles, the micro bubbles can be generated in the processing solution by using, for example, a micro bubble generator having a gas-liquid mixing pump, a spin accelerator, and a disperser, or a micro bubble generator having a gas dissolving unit. In order to generate large quantities of micro bubbles in the processing solution, however, it is necessary to use such a large micro bubble generator as described above. This increases the size of the entire substrate processing apparatus.

SUMMARY OF THE INVENTION

The present invention is directed to a substrate processing apparatus that performs a predetermined process of a substrate by using a processing solution.

According to the present invention, a substrate processing apparatus includes a buffer bath for storing a processing solution at any point in a supplying passage of a processing solution supplying part, and a micro bubble generating part for generating micro bubbles into a processing solution stored in the buffer bath.

Large quantities of micro bubbles can be generated in the buffer bath, and the micro bubbles can be supplied together with the processing solution from the buffer bath to the substrate. This enables the large quantities of micro bubbles to be supplied to the surrounding of the substrate, while the use of the small micro bubble generator avoids an increase in the overall size of the substrate processing apparatus.

Preferably, the processing solution supplying part has a first feeding passage for feeding a processing solution through the buffer bath, and a second feeding passage for feeding a processing solution without passing through the buffer bath, so that a processing solution containing micro bubbles fed from the first feeding passage can be joined with a processing solution fed from the second feeding passage so as to be supplied together.

This reduces the amount of a processing solution that should be stored in the buffer bath, thereby reducing the size of the buffer bath.

Preferably, the substrate processing apparatus further includes a flow rate regulating part for regulating a flow rate of a processing solution fed from either or both of the first feeding passage and the second feeding passage.

The mixing ratio of the processing solution fed from the first feeding passage and the processing solution fed from the second feeding passage can be regulated thereby to arbitrarily regulate the amount of micro bubbles contained in the processing solution supplied to the processing bath.

Preferably, an amount of a processing solution supplied to the buffer bath is substantially identical with an amount of a processing solution pumped from the buffer bath.

The amount of the processing solution within the buffer bath can be held constant and hence the processing solution containing micro bubbles can be supplied stably. The buffer bath can be further reduced in size because the amount of the processing solution within the buffer bath remains unchanged.

Preferably, the micro bubble generating part has a micro bubble generator provided with a container having an internal side surface in substantially conical shape, a processing solution introducing part for introducing a processing solution along the internal side surface of the container, a gas introducing part for introducing a predetermined gas into the container, and a discharging part for discharging a processing solution and a gas from a convergent side of the container. The micro bubble generator generates micro bubbles in a processing solution by discharging into the discharging part a two-layer rotating flow formed of a processing solution and a gas, the two-layer rotating flow being caused within the container.

This eliminates the necessity for a power source in the micro bubble generating part itself, thereby reducing the size of the micro bubble generating part.

Preferably, the micro bubble generating part has a plurality of the micro bubble generators in the buffer bath.

Large quantities of micro bubbles can be generated in the buffer bath per predetermined time.

Preferably, the processing solution supplying part has a non-pulsation pump for pumping and feeding a processing solution stored in the buffer bath to a substrate.

The processing solution can be pumped from the buffer bath and fed to the substrate, while preventing variations in the flow rate of the processing solution.

Preferably, the substrate processing apparatus further includes an ultrasonic vibration supplying part for supplying ultrasonic vibration to a substrate being processed by a processing solution.

The particles can be separated from the substrate by the physical shock of ultrasonic vibration, and the particles so separated can be adsorbed and removed by the micro bubbles. This permits efficient removal of the particles from the surface of the substrate.

Preferably, the substrate processing apparatus further includes an optical sensor for projecting and receiving light through a processing solution in the buffer bath.

This enables to detect whether sufficient micro bubbles are supplied into the buffer bath.

Preferably, the substrate processing apparatus further includes a controller for controlling the micro bubble generating part based on a detection signal of the optical sensor.

Controlling the micro bubble generating part by the controller can automatically create the condition where sufficient micro bubbles are supplied into the buffer bath.

The present invention is also directed to a substrate processing method of performing a predetermined process of a substrate by using a processing solution.

Accordingly, an object of the present invention is to provide the substrate processing apparatus capable of supplying large quantities of micro bubbles to the surrounding of the substrate, while avoiding an increase in the size of the substrate processing apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a longitudinal section of a micro bubble generator taken on a plane parallel to a direction to discharge micro bubble water;

FIG. 3 is a longitudinal section of the micro bubble generator taken along the line III-III in FIG. 2;

DESCRIPTION OF THE PREFERRED EMBODIMENTS

Preferred embodiments of the present invention will be described below with reference to the accompanying drawings.

1. First Preferred Embodiment

<1-1. Construction of Substrate Processing Apparatus>

Figure 1:
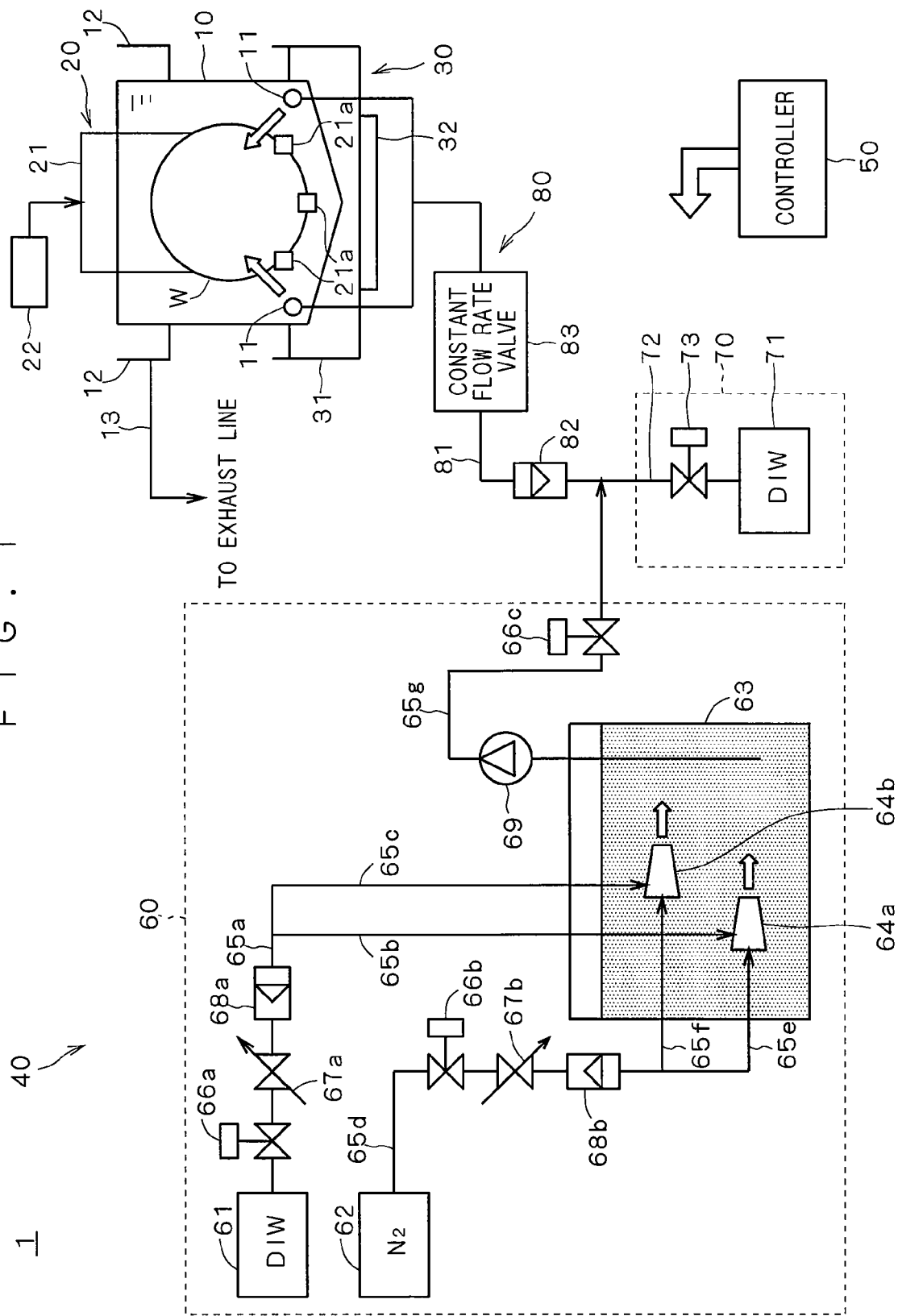
FIG. 1 is a diagram illustrating the construction of a substrate processing apparatus according to a first preferred embodiment of the present invention.

FIG. 1 is a diagram illustrating the construction of a substrate processing apparatus 1 according to a first preferred embodiment of the present invention. The substrate processing apparatus 1 is an apparatus by which a plurality of substrates (hereinafter referred to simply as "substrates") W are immersed at a time in deionized water stored in a processing bath 10 in order to remove particles adhered on the surfaces of the substrates W. As illustrated in FIG. 1, the substrate processing apparatus 1 is mainly provided with the processing bath 10, a lifter 20, an ultrasonic vibration supplying part 30, a deionized water supplying part 40, and a controller 50.

The processing bath 10 is a container for storing deionized water as a processing solution. A pair of discharging parts 11 are disposed on the bottom of the processing bath 10, and the deionized water can be discharged from the discharging parts 11 into the processing bath 10, as shown by the white arrows. The upper surface of the processing bath 10 is opened, and an external bath 12 is disposed at an upper end of the external side surface thereof. The deionized water discharged from the discharging parts 11 into the processing bath 10 is then stored in the processing bath 10, and thereafter overflows the upper part of the processing bath 10 into the external bath 12. The deionized water overflowed into the external bath 12 is then exhausted via piping 13 to an exhaust line.

The lifter 20 is a transportation mechanism that holds and transports vertically the substrates W. The lifter 20 has a holding part 21 having three holding rods 21a. Each of the three holding rods 21a is provided with a plurality of holding grooves (not shown). The substrates W are held in upstanding condition on the holding grooves. A lifter driving part 22 having a servo motor, a timing belt and the like, is connected to the holding part 21. When the lifter driving part 22 is operated, the holding part 21 holding the substrates W is moved vertically, so that the substrates W can be transported between an immersing position in the processing bath 10 and a lifting position above the processing bath 10.

The ultrasonic vibration supplying part 30 is a mechanism for supplying ultrasonic vibration to the substrates W immersed in the deionized water within the processing bath 10. The ultrasonic vibration supplying part 30 has a propagation bath 31 for storing a propagation liquid (e.g., deionized water) as a propagation medium of ultrasonic vibration, and an ultrasonic vibrator 32 disposed on the reverse side of the bottom of the propagation bath 31. Operating the ultrasonic vibrator 32 will cause ultrasonic vibration, and the ultrasonic vibration vibrates in sequence the bottom of the propagation bath 31, the propagation liquid, the bottom of the processing bath 10, and the deionized water within the processing bath 10, and it is finally propagated to the surfaces of the substrates W.

The deionized water supplying part 40 is a piping system for supplying deionized water into the processing bath 10. The deionized water supplying part 40 has a first piping part 60 for feeding deionized water containing micro bubbles (hereinafter referred to as "micro bubble water"), a second piping part 70 for feeding only deionized water, and a third piping part 80 where the micro bubble water and the deionized water are joined and introduced together to the discharging parts 11.

The first piping part 60 has a deionized water supply source 61, a nitrogen gas supply source 62, a buffer bath 63, micro bubble generators 64a and 64b, piping 65a to 65g, switching valves 66a to 66c, flow rate regulating valves 67a and 67b, flow meters 68a and 68b, and a pump 69. The piping 65a is connected to the deionized water supply source 61, and the switching valve 66a, the flow rate regulating valve 67a, and the flow meter 68a are interposed in sequence from the upstream side in the passage of the piping 65a. The other end of the piping 65a is branched into the piping 65b and the piping 65c, which are connected to the micro bubble generators 64a and 64b within the buffer bath 63, respectively. Consequently, when the switching valve 66a is opened, the deionized water supplied from the deionized water supply source 61 can be introduced through the piping 65a, 65b, and 65c to the micro bubble generators 64a and 64b.

The piping 65d is connected to the nitrogen gas supply source 62, and the switching valve 66b, the flow rate regulating valve 67b, and the flow meter 68b are interposed in sequence from the upstream side in the passage of the piping 65d. The other end side of the piping 65d is branched into the piping 65e and the piping 65f, which are connected to the micro bubble generators 64a and 64b within the buffer bath 63, respectively. Consequently, when the switching valve 66b is opened, the nitrogen gas supplied from the nitrogen gas supply source 62 can be introduced through the piping 65d, 65e, and 65f to the micro bubble generators 64a and 64b.

Deionized water is stored in the buffer bath 63, and the two micro bubble generators 64a and 64b are immersed in the deionized water. The micro bubble generators 64a and 64b are devices that generate micro bubble water by mixing deionized water and nitrogen gas. FIG. 2 is a longitudinal section of the micro bubble generator 64a taken on a plane parallel to a direction to discharge micro bubble water. FIG. 3 is a longitudinal section of the micro bubble generator 64a taken along the line III-III in FIG. 2. Referring to FIGS. 2 and 3, the micro bubble generator 64a is constructed of a container 641 having an internal side surface in substantially conical shape, and a deionized water admission port 642, a nitrogen gas admission port 643, and a micro bubble water discharge port 644 are formed so as to make communication between the inside and the outside of the container 641.

The deionized water admission port 642 is connected to the piping 65b so that deionized water can be guided along the internal side surface of the container 641 to the inside of the container 641. As shown by the arrowed broken line in FIG. 2, and the arrow-pointed broken lines in FIG. 3, the deionized water introduced in the inside of the container 641 flows toward the convergent direction in the inside of the container 641, while causing a rotating flow along the internal side surface of the container 641. The nitrogen gas admission port 643 is formed on the conical bottom side in the inside of the container 641, and connected to the piping 65e. The nitrogen gas introduced from the nitrogen gas admission port 643 to the inside of the container 641 is low in specific gravity and hence can be collected at the center of rotation of the rotating flow existing in the inside of the container 641, enabling a narrow girdle G to be formed. As the result, a gas-liquid two-layer rotating flow formed of deionized water and nitrogen gas can be caused in the inside of the container 641. When deionized water and nitrogen gas are discharged from the micro bubble water discharge port 644 provided on the convergent side in the container 641, the rotation speed of the rotating flow is rapidly damped, and the girdle G of nitrogen gas is cut, resulting in micro bubbles as fine bubbles in the order of micro meter.

Thus, the micro bubble water can be discharged from the micro bubble water discharge port 644 of the micro bubble generator 64a, and the discharged micro bubble water can be stored in the buffer bath 63. The micro bubble generator 64a itself requires no power and hence can be constructed as a unit having a relatively small size. The construction of the micro bubble generator 64b is identical with that of the micro bubble generator 64a, except that the deionized water admission port 642 is connected to the piping 65c, and the nitrogen gas admission port 643 is connected to the piping 65f. Therefore, the overlapping description is omitted here.

Returning to FIG. 1, the piping 65g for pumping deionized water is connected to the buffer bath 63. The non-pulsation pump 69 and the switching valve 66c are interposed in sequence from the upstream side in the passage of the piping 65g, and the other end side of the piping 65g is connected to the third piping part 80. Therefore, when the switching valve 66c is opened and the pump 69 is operated, the micro bubble water stored in the buffer bath 63 can be pumped and fed via the piping 65g to the third piping part 80. Thus, the buffer bath 63 is interposed in the deionized water supply passage in the first piping part 60, and constructed so as to generate micro bubble water in the inside thereof.

The second piping part 70 has a deionized water supply source 71, piping 72, and a switching valve 73. The piping 72 is connected to the deionized water supply source 71, and the switching valve 73 is interposed in the passage of the piping 72. The other end side of the piping 72 is connected to the third piping part 80. Therefore, when the switching valve 73 is opened, deionized water can be fed from the deionized water supply source 71 via the piping 72 to the third piping part 80.

The third piping part 80 has piping 81, and a flow meter 82 and a constant flow rate valve 83 are interposed in the passage of the piping 81. The micro bubble water fed from the first piping part 60 and the deionized water fed from the second piping part 70 are joined and introduced together to the piping 81, and then supplied through the piping 81 to the discharging parts 11 in the processing bath 10.

The controller 50 is electrically connected to the lifter driving part 22, the ultrasonic vibrator 32, the switching valves 66a to 66c, the flow rate regulating valves 67a and 67b, the flow meters 68a, 68b, and 82, the pump 69, and the constant flow rate valve 83, in order to control the operations of these. The controller 50 is constructed of a computer having a CPU and a memory, and performs the control operations by the CPU executing arithmetic processing under a predetermined program. For example, the controller 50 regulates the opening of the flow rate regulating valve 67a based on the result of measurement of the flow meter 68a. This enables regulation of the flow rate of the deionized water supplied from the deionized water supply source 61 to the micro bubble generators 64a and 64b. The controller 50 also controls the opening of the flow rate regulating valve 67b based on the result of measurement of the flow meter 68b. This enables regulation of the flow rate of the nitrogen gas supplied from the nitrogen gas supply source 62 to the micro bubble generators 64a and 64b. The controller 50 also controls the constant flow rate valve 83 based on the result of measurement of the flow meter 82. This enables the flow rate of the deionized water or the micro bubble water supplied to the processing bath 10 to be held constant.

<1-2. Operations of Substrate Processing Apparatus>

Figure 4:
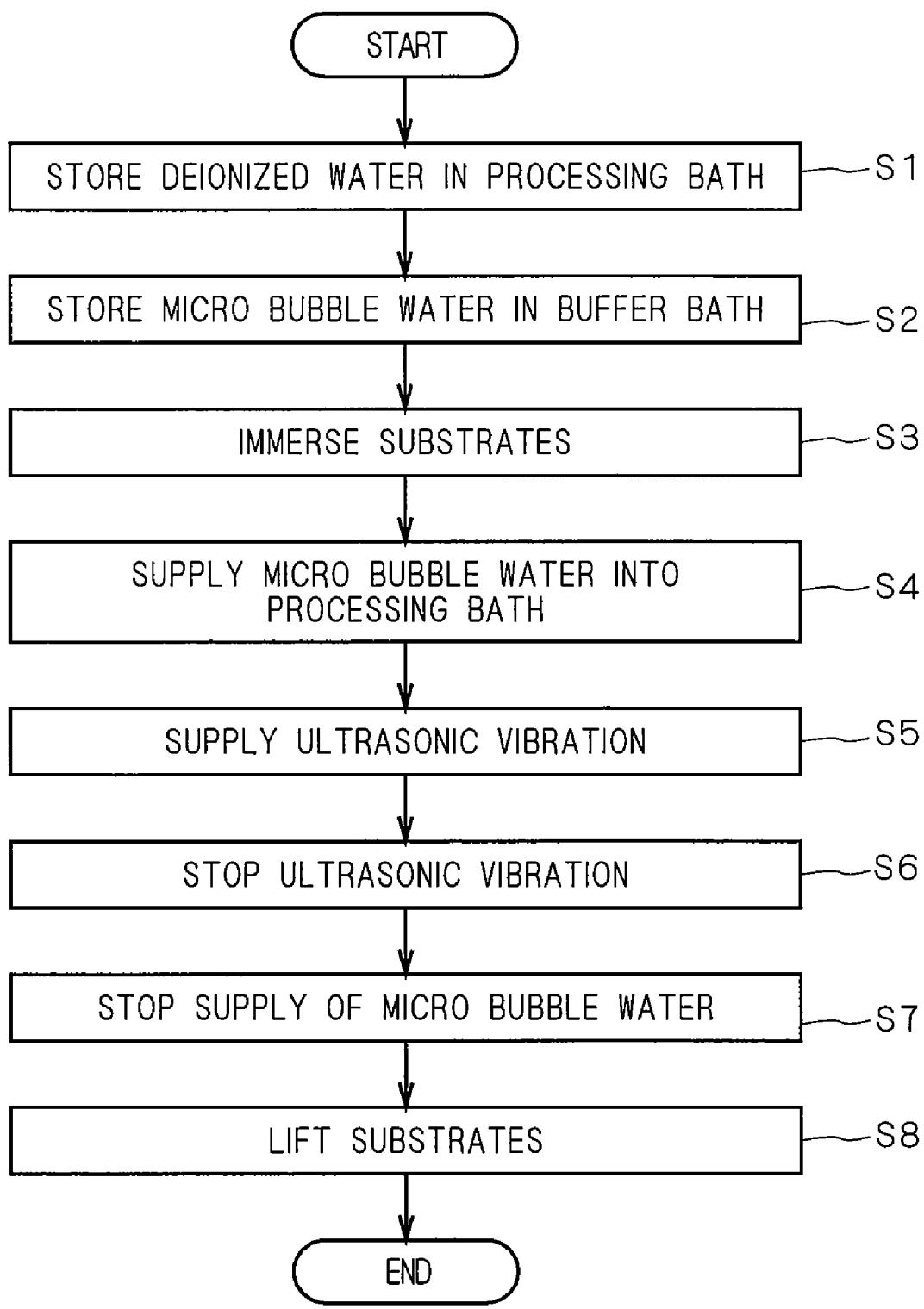
FIG. 4 is a flow chart illustrating the flow of a substrate processing by the substrate processing apparatus.

The operations of the above-mentioned substrate processing apparatus 1 will next be described. FIG. 4 is a flow chart illustrating the flow of the substrate processing performed by the substrate processing apparatus 1. The following operations can be advanced by the controller 50 controlling the lifter driving part 22, the ultrasonic vibrator 32, the switching valves 66a to 66c, and 73, the flow rate regulating valves 67a and 67b, the flow meters 68a, 68b, and 82, the pump 69, and the constant flow rate valve 83.

The substrate processing by the substrate processing apparatus 1 will be performed as follows. First, the substrate processing apparatus 1 opens the switching valve 73 with the switching valve 66c closed. This enables deionized water to be supplied from the deionized water supply source 71 via the piping 72 and 81 and the discharge parts 11 to the processing bath 10, and then stored in the processing bath 10 (step S1). The supply of deionized water from the deionized water supply source 71 will be continued thereafter, and the deionized water overflowed the upper part of the processing bath 10 into the external bath 12 can be exhausted through the piping 13 to the exhaust line.

On the other hand, the substrate processing apparatus 1 opens the switching valves 66a and 66b of the first piping part 60 to introduce deionized water and nitrogen gas into each of the micro bubble generators 64a and 64b. The micro bubble generators 64a and 64b discharge the introduced deionized water and the introduced nitrogen gas as micro bubble water, and store the micro bubble water in the buffer bath 63 (step S2). Thus, the substrate processing apparatus 1 generates and stores a predetermined amount of micro bubbles in the buffer bath 63 by the time the supply of micro bubbles is started in step S4 described later.

Next, the substrate processing apparatus 1 operates the lifter driving part 22 to have the holding part 21 come down. This enables the substrates W to be immersed in the deionized water stored in the processing bath 10 (step S3). At the completion of the immersion of the substrates W, the substrate processing apparatus 1 opens the switching valve 66c of the first piping part 60, and operates the pump 69. As the result, the micro bubble water stored in the buffer bath 63 can be pumped, and this micro bubble water can be joined with the deionized water supplied from the deionized water supply source 71 and then fed together to the piping 81. The resulting micro bubble water can be discharged from the discharging parts 11 into the processing bath 10 and then supplied to the surroundings of the substrates W (step S4). The substrate processing apparatus 1 also operates the ultrasonic vibrator 32 to cause ultrasonic vibration. The ultrasonic vibration caused by the ultrasonic vibrator 32 vibrates in sequence the bottom of the propagation bath 31, the propagation liquid, the bottom of the processing bath 10, and the deionized water within the processing bath 10, and it is finally propagated to the surfaces of the substrates W (step S5).

At this time, the particles adhered on the substrates W are subject to the shock of the ultrasonic vibration from the ultrasonic vibrator 32, and they separate from the surfaces of the substrates W. In the inside of the processing bath 10, there arises a stream of deionized water directed to the upper part of the processing bath 10, and the micro bubbles contained in this stream move upward in the processing bath 10. Consequently, the particles separated from the surfaces of the substrates W can be adhered to the micro bubbles and then conveyed upward in the processing bath 10, together with the micro bubbles. The individual micro bubbles have a micro size and therefore the entire surface area thereof (the area of a gas-liquid interface) is large. Hence, the micro bubbles can adsorb efficiently the particles separated from the substrates W. Since the micro bubbles also have electrostatic property, they can attract and adsorb efficiently the particles by electrostatic action. The micro bubbles with the particles overflow the upper part of the processing bath 10, together with deionized water, to the external bath 12 and exhausted through the piping 13 to the exhaust line.

After the supply of micro bubbles and the supply of ultrasonic vibration are continued for a predetermined time, the substrate processing apparatus 1 stops the operation of the ultrasonic vibrator 32, continuing only the supply of micro bubbles (step S6). As the result, the particles remaining in the deionized water can be adsorbed by the micro bubbles and then exhausted to the outside of the processing bath 10. This prevents the particles remaining in the processing bath 10 from adhering again to the substrates W. Thereafter, the substrate processing apparatus 1 closes the switching valves 66a, 66b, and 66c to stop the supply of micro bubble water (step S7). Finally, the substrate processing apparatus 1 operates the lifter driving part 22 to have the holding part 21 move up to lift the substrates W from the deionized water within the processing bath 10 (step S8). Thus, the process of the substrates W in the substrate processing apparatus 1 is completed.

As described above, the substrate processing apparatus 1 generates large quantities of micro bubbles in the inside of the buffer bath 63, and supplies the micro bubbles from the buffer bath 63 to the processing bath 10. This enables large quantities of micro bubbles to be supplied to the surroundings of the substrates W, while the use of the small micro bubble generators 64a and 64b avoids an increase in the size of the substrate processing apparatus 1.

The deionized water supplying part 40 of the substrate processing apparatus 1 has the first piping part for feeding deionized water through the buffer bath 63, and the second piping part 70 for feeding deionized water without passing through the buffer bath 63, so that the micro bubble water fed from the first piping part 60 and the deionized water fed from the second piping part 70 can be joined and supplied together to the processing bath 10. This reduces the amount of deionized water that should be stored in the buffer bath 63, thereby reducing the size of the buffer bath 63.

The substrate processing apparatus 1 can also regulate the flow rate of micro bubble water pumped from the buffer bath 63 by regulating the pumping amount of the pump 69. This enables regulation of the mixing ratio of the micro bubble water pumped from the buffer bath 63 and the deionized water supplied from the deionized water supply source 71, thereby arbitrarily regulating the concentration of micro bubble water (the amount of micro bubbles contained per unit amount) to be supplied to the processing bath 10.

The substrate processing apparatus 1 has the two micro bubble generators 64a and 64b which are disposed in parallel in the buffer bath 63. This enables large quantities of micro bubbles to be generated per predetermined time in the buffer bath 63.

In the substrate processing apparatus 1, the non-pulsation pump 69 pumps and supplies the micro bubble water stored in the buffer bath 63 to the processing bath 10. The non-pulsation pump 69 is stable in the pumping amount and hence it is easy to regulate the mixing ratio of the micro bubble water pumped from the buffer bath 63 and the deionized water supplied from the deionized water supply source 71. It is also capable of preventing variations in the flow rate in the piping 81 that is held constant by the constant flow rate valve 83.

The substrate processing apparatus 1 further includes the ultrasonic vibration supplying part 30 for supplying ultrasonic vibration to the substrates immersed in a processing solution within the processing bath 10. Consequently, the particles can be separated from the substrates W by the physical shock of ultrasonic vibration, and the particles so separated can be adsorbed and removed by the micro bubbles. This permits efficient removal of the particles from the surfaces of the substrates W.

2. Second Preferred Embodiment

Figure 5:
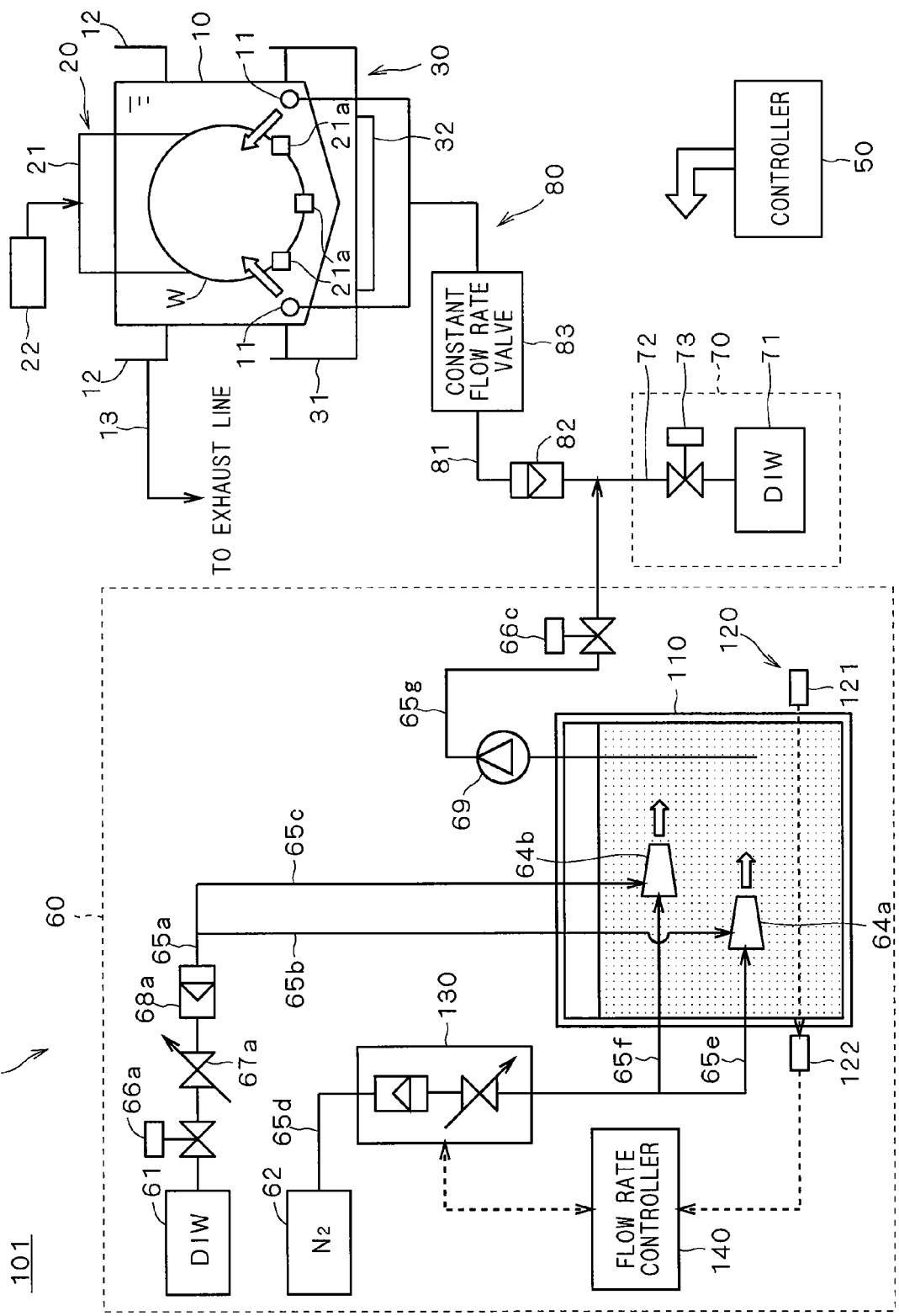
FIG. 5 is a diagram illustrating the construction of a substrate processing apparatus according to a second preferred embodiment of the present invention.

A second preferred embodiment of the present invention will be described below. FIG. 5 is a diagram illustrating the construction of a substrate processing apparatus 101 according to the second preferred embodiment. The substrate processing apparatus 101 is identical in construction to the above-mentioned substrate processing apparatus 1, except for a buffer bath 110, an optical sensor 120, a mass flow controller 130, and a flow rate controller 140. Therefore, the following description is primarily concerned with the differences from the substrate processing apparatus 1, and like parts have similar reference numbers with the overlapping description omitted.

The substrate processing apparatus 101 of the second preferred embodiment has the buffer bath 110 formed of a translucent material (e.g., quartz glass of high purity). The side part of the buffer bath 110 is provided with an optical sensor 120 having a pair of a light projecting device 121 and a light receiving device 122. The light projecting device 121 and the light receiving device 122 are oppositely arranged with the buffer bath 110 interposed therebetween. The positional relationship between the light projecting device 121 and the light receiving device 122 is defined so that the light emitted from the light projecting device 121 can be directed to the light receiving device 122 via a processing solution within the buffer bath 110. The substrate processing apparatus 101 detects whether sufficient micro bubbles are supplied into the buffer bath 110, by using the optical sensor 120 so constructed. The detection operation of the optical sensor 120 is as follows.

Figure 6:
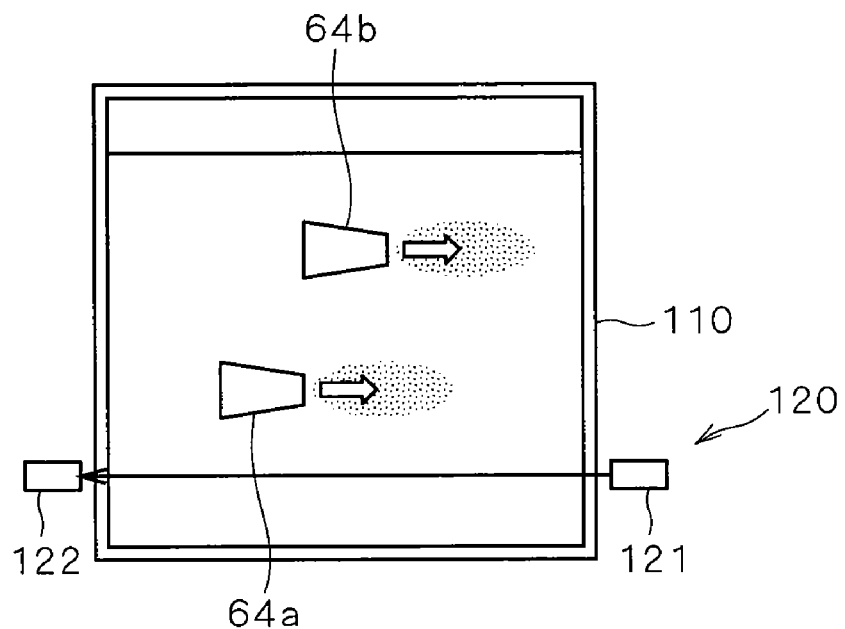
FIGS. 6 to 8 are diagrams, each illustrating the condition of micro bubble water stored in a buffer bath, and the operation of an optical sensor.
Figure 7:
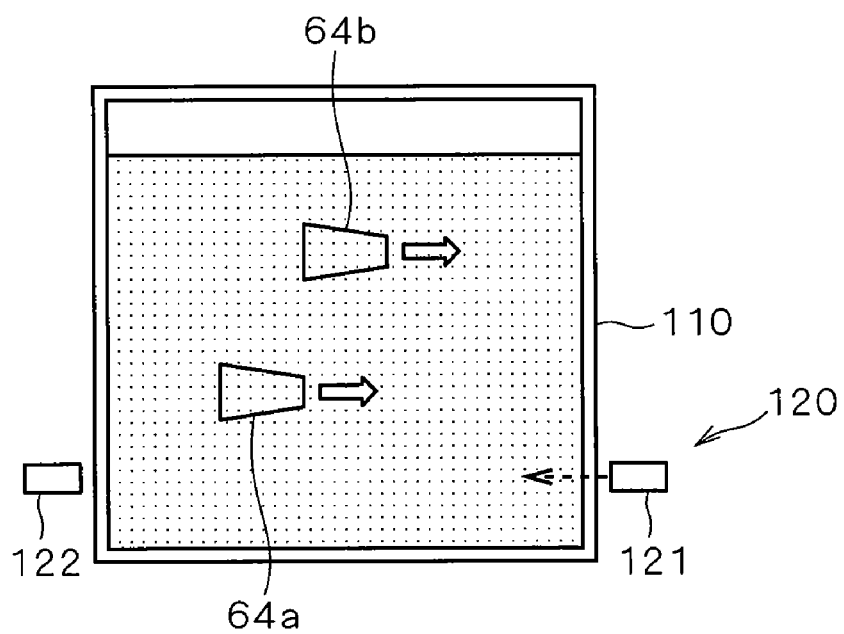
Figure 8:
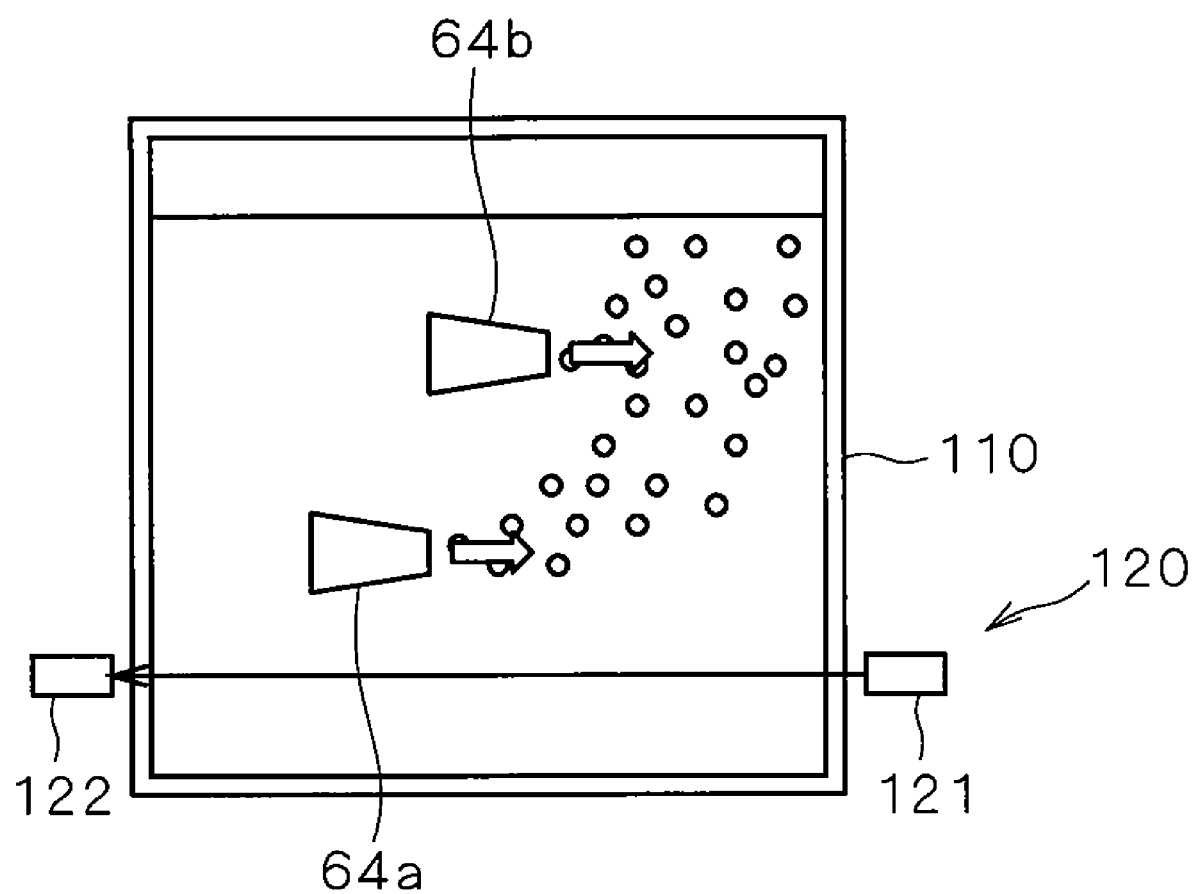

FIGS. 6 to 8 are diagrams each illustrating the condition of micro bubble water stored in the buffer bath 110, and the operation of the optical sensor 120. For example, as illustrate in FIG. 6, when sufficient micro bubbles are not supplied to the buffer bath 110, the transparency of the micro bubble water in the buffer bath 110 is relatively high. Therefore, the light emitted from the light projecting device 121 reaches the light receiving device 122, and the light receiving device 122 detects the light. On the other hand, as illustrated in FIG. 7, when sufficient micro bubbles are supplied into the buffer bath 110, the micro bubble water in the buffer bath 110 becomes cloudy and its transparency is lowered. Therefore, the light emitted from the light projecting device 121 cannot reach the light receiving device 122, and the light receiving device 122 cannot detect the light.

As illustrated in FIG. 8, when relatively large bubbles (which are larger than micro bubbles) are discharged from micro bubble generators 64a and 64b, deionized water cannot become cloudy due to these large bubbles. Therefore, the light emitted from the light projecting device 121 reaches the light receiving device 122, and the light receiving device 122 can detect the light. That is, only when sufficient micro bubbles are supplied into the buffer bath 110, the optical sensor 120 can become shading state, and the light receiving device 122 stops to receive light. Accordingly, based on the stop of light receiving at the light receiving device 122, the optical sensor 120 can sense that sufficient micro bubbles have been supplied into the buffer bath 110.

Returning to FIG. 5, the mass flow controller 130 as a flow rate regulating valve being electrically controllable is interposed in the passage of the piping 65d extending from the nitrogen gas supply source 62. The above-mentioned light receiving device 122 and the mass flow controller 130 are connected via a predetermined communication line to the flow rate controller 140. The flow rate controller 140 receives a detection signal from the light receiving device 122, and also controls the operation of the mass flow controller 130 based on the detection signal. This enables regulation of the flow rate of nitrogen gas passing through the piping 65d, and regulation of the amount of micro bubbles discharged from the micro bubble generators 64a and 64b. Alternatively, the flow rate controller 140 may be configured by a computer common to the controller 50, or by a separate computer.

Like the substrate processing apparatus 1, the substrate processing apparatus 101 processes substrates W in accordance with the flow chart of FIG. 4. It is noted that, when storing micro bubble water in the buffer bath 110, the optical sensor 120 is operated so as to control the flow rate set to the mass flow controller 130 based on a detection signal of the light receiving device 122. For example, when the light receiving device 122 is receiving light, it can be regarded that sufficient micro bubbles are not supplied into the buffer bath 110, and the flow rate set to the mass flow controller 130 is increased gradually. When the light receiving device 122 stops to receive light, it can be regarded that sufficient micro bubbles are supplied into the buffer bath 110, and the flow rate set at that time to the mass flow controller 130 is maintained. Thus, the substrate processing apparatus 101 controls the discharge rate of micro bubbles in order to create the condition where sufficient micro bubbles are supplied into the buffer bath 110 (the condition as illustrated in FIG. 7).

As above described, the substrate processing apparatus 101 is provided with the optical sensor 120 performing light projection and light receiving through the deionized water within the buffer bath 110. It is therefore capable of detecting whether sufficient micro bubbles are supplied into the buffer bath 110. Based on the detection signal of the light receiving device 112, the substrate processing apparatus 101 controls the mass flow controller 130 to regulate the amount of micro bubbles discharged from the micro bubble generators 64a and 64b. It is therefore capable of automatically creating the condition where sufficient micro bubbles are supplied into the buffer bath 110.

The substrate processing apparatus 101 also feeds the nitrogen gas supplied from a nitrogen gas supply source 62 via the mass flow controller 130 to the micro bubble generators 64a and 64b. Hence, even if the supply rate of nitrogen gas from the nitrogen gas supply source 62 is varied, the nitrogen gas can be supplied at a constant flow rate.

The substrate processing apparatus 101 is adapted to control the flow rate of nitrogen gas by the flow rate controller 140. Alternatively, the flow rate of deionized water may be controlled with the flow rate of nitrogen gas held constant. Specifically, a mass flow controller may be interposed in the passage of piping 65a for deionized water, so that the flow rate controller 140 can control the mass flow controller. However, the flow rate can be controlled stably by controlling the flow rate of nitrogen gas as compressible fluid, than controlling the flow rate of deionized water as incompressible fluid. Alternatively, both the flow rate of nitrogen gas and the flow rate of deionized water may be controlled. However, the way of fixing one of the two flow rates and controlling the other enables the flow rate to be controlled stably without causing hunting.

3. Modifications

While the preferred embodiments of the present invention have been disclosed and described, the present invention is not limited thereto. Although the substrate processing apparatus 1 uses deionized water as a processing solution, other chemical solution, such as SC-1 solution having high cleaning effect to the substrates W, may be used as a processing solution. Although the substrate processing apparatus 1 is the apparatus performing only cleaning of the substrates W, it may be constructed to perform other process.

Although in the substrate processing apparatus 1, the two micro bubble generators 64a and 64b are provided in the buffer bath 63, the number of the micro bubble generators may be one or three or more. The micro bubble generators are not limited to the micro bubble generators 64a and 64b, and various known micro bubble generators may be used.

A flow rate regulating valve may be provided in the piping 72 of the second piping part 70, enabling regulation of the flow rate of deionized water supplied from the deionized water supply source 71. This further facilitates regulation of the mixing ratio of the micro bubble water pumped from the buffer bath 63 and the deionized water supplied from the deionized water supply source 71.

In an alternative, the amount of deionized water introduced into the micro bubble generators 64a and 64b, and the amount of micro bubble water pumped from the buffer bath 63 may be substantially equalized by controlling the operations of the flow rate regulating valve 67a and the pump 69 based on the measured value of the flow meter 68a. With this construction, the micro bubble water within the buffer bath 63 can be held at a constant amount, and the micro bubble water can be supplied stably to the processing bath 10. The amount of the micro bubble water within the buffer bath 63 remains unchanged, permitting a further reduction in the size of the buffer bath 63.

Figure 9:
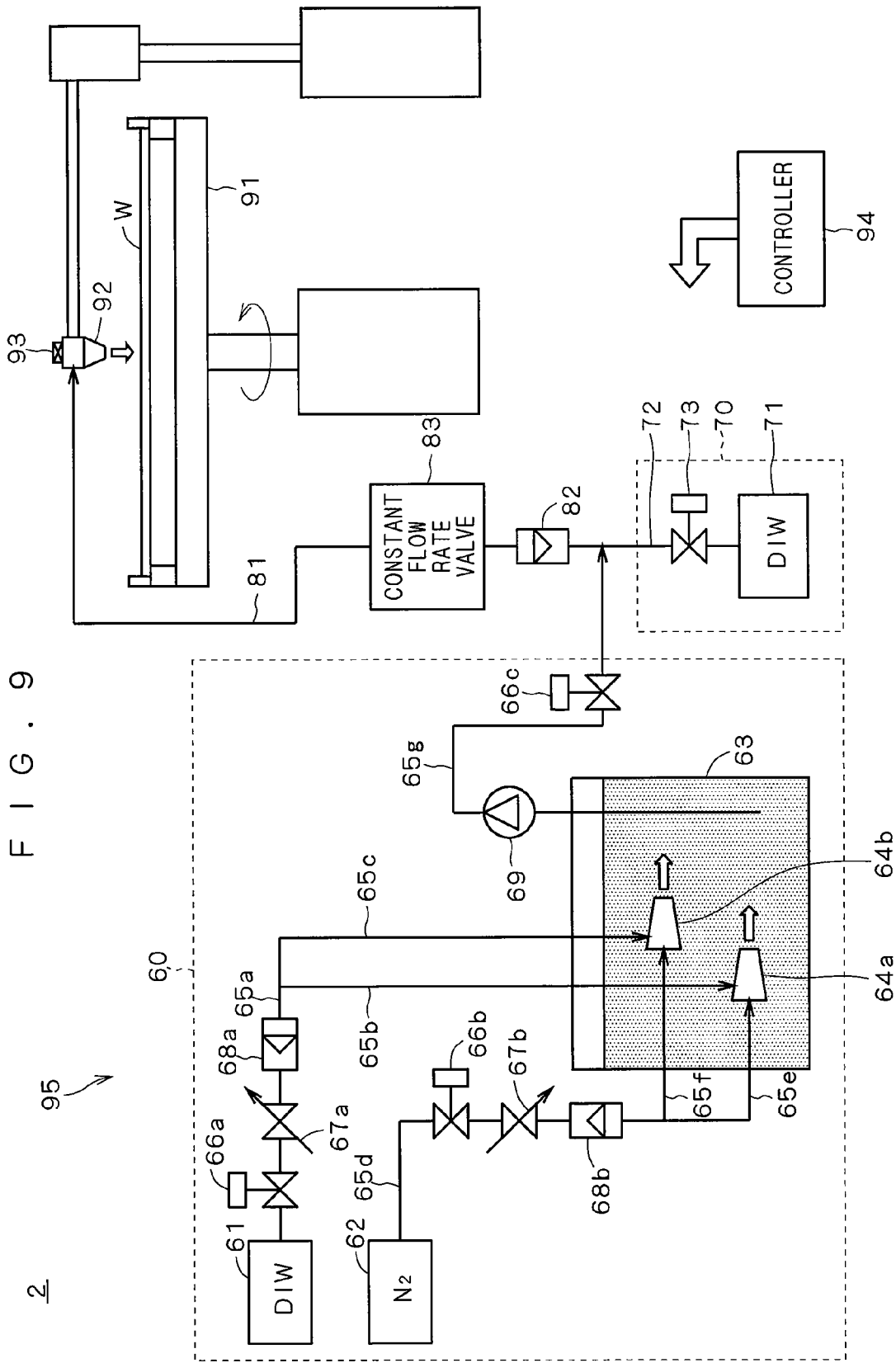
FIGS. 9 and 10 are diagrams, each illustrating the construction of a substrate processing apparatus of single wafer processing according to the present invention.

Although the first preferred embodiment has described the substrate processing apparatus 1 of batch processing by which a plurality of substrates W are immersed at a time in the processing bath 10, the substrate processing apparatus of the present invention may be a substrate processing apparatus 2 of single wafer processing, as illustrated in FIG. 9. In the substrate processing apparatus 2 of FIG. 9, a substrate W is rotated around a vertical axis while being held in its horizontal attitude by a holding part 91, and the surface of the substrate W is cleaned by discharging deionized water from a discharging part 92 against the surface of the substrate W. The discharging part 92 is equipped with an ultrasonic vibrator 93, and when the ultrasonic vibrator 93 is operated, ultrasonic vibration can be supplied to the deionized water discharged from the discharging part 92. A controller 94 controls the respective parts of the substrate processing apparatus 2. Also in the substrate processing apparatus 2, the same construction as the deionized water supplying part 40 in FIG. 1 is applied to a deionized water supplying part 95 connected to the discharging part 92. This provides the same effect as in the substrate processing apparatus 1.

Figure 10:
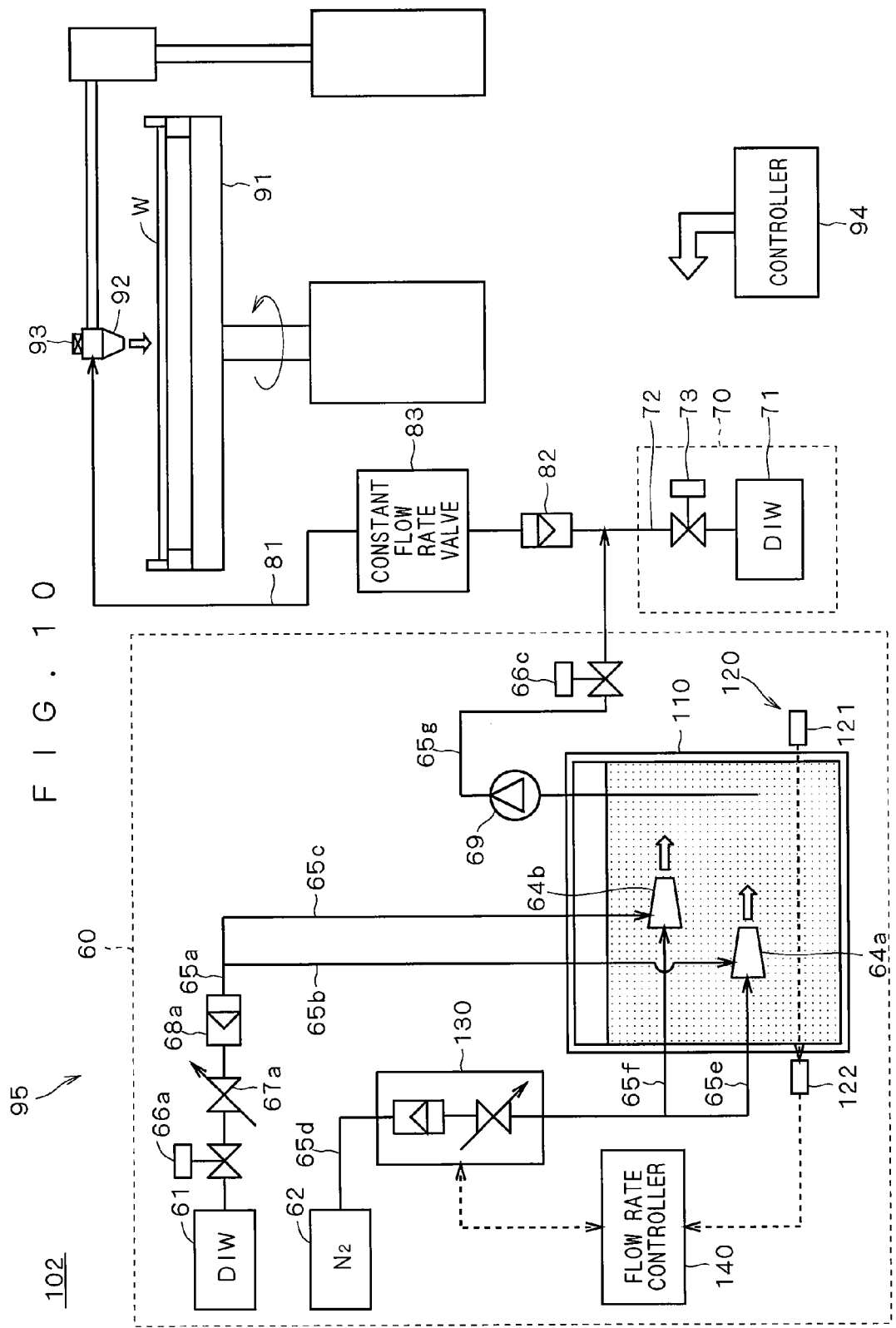

Although the second preferred embodiment has described the substrate processing apparatus 101 of batch processing by which a plurality of substrates W are immersed at a time in the processing bath 10, the substrate processing apparatus of the present invention may be a substrate processing apparatus 102 of single wafer processing, as illustrated in FIG. 10. In the substrate processing apparatus 102 of FIG. 10, a substrate W is rotated around a vertical axis while being held in its horizontal attitude by a holding part 91, and the surface of the substrate W is cleaned by discharging deionized water from a discharging part 92 against the surface of the substrate W. The discharging part 92 is equipped with an ultrasonic vibrator 93, and when the ultrasonic vibrator 93 is operated, ultrasonic vibration can be applied to the deionized water discharged from the discharging part 92. A controller 94 controls the respective parts of the substrate processing apparatus 102. Also in the substrate processing apparatus 102, the same construction as the deionized water supplying part 40 in FIG. 5 is applied to a deionized water supplying part 95 connected to the discharging part 92. This provides the same effect as in the substrate processing apparatus 101.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus that performs a predetermined substrate process by using a processing solution, comprising:
    a processing bath for storing a processing solution;
    a holding part for holding a substrate in said processing bath;
    a processing solution supplying part for supplying processing solution to said processing bath;
    a buffer bath for storing processing solution at any point in a supplying passage of said processing solution supplying part; and
    a micro bubble generating part for generating micro bubbles in processing solution stored in said buffer bath,
    wherein, said processing solution supplying part has a first feeding passage for feeding processing solution through said buffer bath and a second feeding passage for feeding processing solution without passing through said buffer bath, so that processing solution containing micro bubbles fed from said first feeding passage can be joined with processing solution fed from said second feeding passage so as to be supplied together.

2. The substrate processing apparatus according to claim 1, further comprising:
    a flow rate regulating part for regulating a flow rate of processing solution fed from either or both of said first feeding passage and said second feeding passage.

3. The substrate processing apparatus according to claim 1, further comprising:
    a flow rate regulating part for regulating a flow rate of processing solution fed from either or both of said first feeding passage and said second feeding passage.

4. The substrate processing apparatus according to claim 2, wherein an amount of processing solution supplied to said buffer bath is substantially identical with an amount of a processing solution pumped from said buffer bath.

5. The substrate processing apparatus according to claim 4, wherein said micro bubble generating part has a micro bubble generator provided with a container having an internal side surface in substantially conical shape, a processing solution introducing part for introducing processing solution along said internal side surface of said container, a gas introducing part for introducing a predetermined gas into said container, and a discharging part for discharging processing solution and a gas from a convergent side of said container, said micro bubble generator generating micro bubbles in the processing solution by discharging into said discharging part a two-layer rotating flow formed of processing solution and gas, said two-layer rotating flow being caused within said container.

6. The substrate processing apparatus according to claim 5, wherein said micro bubble generating part has a plurality of said micro bubble generators in said buffer bath.

7. The substrate processing apparatus according to claim 6, wherein said processing solution supplying part has a non-pulsation pump for pumping and feeding processing solution stored in said buffer bath to the substrate.

8. The substrate processing apparatus according to claim 7, further comprising:
    an ultrasonic vibration supplying part for supplying ultrasonic vibration to a substrate being processed by a processing solution.

9. The substrate processing apparatus according to claim 8, further comprising:
    an optical sensor for projecting and receiving light through processing solution in said buffer bath.

10. The substrate processing apparatus according to claim 9, further comprising:
    a controller for controlling said micro bubble generating part based on a detection signal of said optical sensor.

11. The substrate processing apparatus according to claim 3, wherein an amount of processing solution supplied to said buffer bath is substantially identical with an amount of processing solution pumped from said buffer bath.

12. The substrate processing apparatus according to claim 11, wherein said micro bubble generating part has a micro bubble generator provided with a container having an internal side surface in substantially conical shape, a processing solution introducing part for introducing processing solution along said internal side surface of said container, a gas introducing part for introducing a predetermined gas into said container, and a discharging part for discharging processing solution and gas from a convergent side of said container, said micro bubble generator generating micro bubbles in the processing solution by discharging into said discharging part a two-layer rotating flow formed of processing solution and gas, said two-layer rotating flow being caused within said container.

13. The substrate processing apparatus according to claim 12, wherein said micro bubble generating part has a plurality of said micro bubble generators in said buffer bath.

14. The substrate processing apparatus according to claim 13, wherein said processing solution supplying part has a non-pulsation pump for pumping and feeding processing solution stored in said buffer bath to a substrate.

15. The substrate processing apparatus according to claim 14, further comprising:
an ultrasonic vibration supplying part for supplying ultrasonic vibrations to the substrate being processed by the processing solution.

16. The substrate processing apparatus according to claim 15, further comprising:
an optical sensor for projecting and receiving light through the processing solution in said buffer bath.

17. The substrate processing apparatus according to claim 16, further comprising:
a controller for controlling said micro bubble generating part based on a detection signal of said optical sensor.

18. A substrate processing apparatus that performs a predetermined substrate process by using a processing solution, comprising:
a holding part for holding a substrate;
a processing solution supplying part for supplying processing solution to a substrate held by said holding part;
a buffer bath for storing processing solution at any point in a supplying passage of said processing solution supplying part; and
a micro bubble generating part for generating micro bubbles in processing solution stored in said buffer bath,
wherein, said processing solution supplying part has a first feeding passage for feeding processing solution through said buffer bath and a second feeding passage for feeding processing solution without passing through said buffer bath, so that processing solution containing micro bubbles fed from said first feeding passage can be joined with processing solution fed from said second feeding passage so as to be supplied together.

* * * * *